United States Patent
Nakagawa

[19]
[11] Patent Number: 6,137,134
[45] Date of Patent: *Oct. 24, 2000

[54] SEMICONDUCTOR MEMORY DEVICE

[75] Inventor: Kenichiro Nakagawa, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/083,054

[22] Filed: May 22, 1998

[30] Foreign Application Priority Data

May 28, 1997 [JP] Japan ................................. 9-138560

[51] Int. Cl.⁷ .................................................. H01L 29/788
[52] U.S. Cl. ........................ 257/316; 257/621; 257/768; 257/770
[58] Field of Search ..................................... 257/316, 315, 257/321, 621, 768, 770

[56] References Cited

U.S. PATENT DOCUMENTS 5,789,802  8/1998  Tripsas ..................................... 257/383
5,894,162  4/1999  Paterson et al. ......................... 257/316

FOREIGN PATENT DOCUMENTS 60-120568  6/1985  Japan .
61-34977   2/1986  Japan .

*Primary Examiner*—J. Carroll
*Attorney, Agent, or Firm*—McGinn & Gibb, P.C.

[57] ABSTRACT

A semiconductor memory device includes a floating gate, a control gate, source and drain regions, a lightly doped region of the second conductivity type, and a silicide layer. The floating gate is formed on a semiconductor substrate of the first conductivity type via a gate insulating film. The control gate is formed on the floating gate via an insulating film. The source and drain regions are formed by diffusing an impurity of the second conductivity type in the surface of the semiconductor substrate on the two sides of the floating gate. The lightly doped region is formed with a surface exposed at a position distant from the floating gate in at least the source region. The lightly doped region has an impurity dose lower than that of the source region. The silicide layer is formed on the exposed surface of the lightly doped region.

8 Claims, 5 Drawing Sheets

SEMICONDUCTOR MEMORY DEVICE

BACKGROUND OF THE INVENTION

The present invention relates to a semiconductor memory device and, more particularly, to an electrically programmable erasable semiconductor memory device.

A conventional electrically programmable erasable flash memory will be explained with reference to FIGS. 5A and 5B. In FIG. 5B, each floating gate 603 is formed on a semiconductor substrate 601 via a gate insulating film 602. A control gate 605 is formed on the floating gate 603 via an insulating film (ONO film) 604. The insulating film 604 has a three-layered structure obtained by sandwiching a silicon nitride film between silicon oxide films.

An impurity-diffused drain 606 and source 607 are formed in the semiconductor substrate 601 on the two sides of the floating gate 603. An interlevel insulating film 610 is formed on the semiconductor substrate 601 to cover the control gate 605. A contact 609a is formed in the interlevel insulating film 610 on the drain 606.

As shown in FIG. 5A, memory cell arrays are formed in the longitudinal direction (lateral direction in FIG. 5A) of the gate to share the drains 606 and the sources 607. In a direction (longitudinal direction in FIG. 5) perpendicular to the longitudinal direction of the gate, a plurality of memory cells defined by element isolation regions 608 on the drain 606 side are formed to constitute memory cell arrays. In each memory cell, the contact 609a is formed on the drain 606. To the contrary, the source 607 side is not partitioned. The common source 607 is continuously formed for a plurality of memory cells on a memory cell array, and one contact 609b is formed for adjacent memory cell arrays.

To form the drain contact 609a, the impurity-diffused region must be wide to a certain degree. Since the source contact 609b need not be formed for each memory cell, one source contact 609b can be shared by one memory cell array, as shown in FIG. 5A. With this arrangement, the interval between the common sources of memory cell arrays can be decreased, thereby reducing the cell size.

The operation of the conventional flash memory will be described. A state of "1" and "0" of the memory cell is set by forming a state wherein electrons enter the floating gate 603 electrically insulated from the surroundings, or a state wherein no electron enters the floating gate 603.

Electrons are injected into the floating gate 603 by the following method. A positive high voltage of 12 V is applied to the control gate 605, and a positive voltage of 6 V is applied to the drain 606. Then, hot electrons are produced near the drain of a channel formed below the gate insulating film 602. Some of the hot electrons are injected into the floating gate 603 (CHE injection).

According to another method, a positive high voltage of 16 V is applied to only the control gate 605 to inject electrons by an FN tunnel current (FN injection).

On the other hand, electrons are extracted from the floating gate 603 by the following method. A negative voltage of −9 V is applied to the control gate 605, and a positive voltage of 5 V is applied to the drain 606 to extract electrons by an FN tunnel current (drain-gate extraction).

By still another method, a positive high voltage of 11 V is applied to only the source 607 to extract electrons (source extraction).

According to still another method, a positive high voltage of 15 V is applied to only the semiconductor substrate 601 (channel) to extract electrons in the floating gate 603 (channel extraction).

To cope with a microcomputer operating at a high speed, a hybrid flash memory must perform a high-speed read, which is unimportant in the use of the conventional flash memory alone. However, a cell array in which the sources of memory cells are connected to contact each other at one portion in the above-mentioned manner is unsuitable for a high-speed read because a high source resistance is generated in a memory cell distant from the contact, and no ON current flows.

In a MOSFET (Metal Oxide Semiconductor Field Effect Transistor) used in a logic circuit or the like to reduce the source resistance, e.g., a titanium silicide layer is formed on the source and drain surfaces of a semiconductor substrate in order to reduce the contact resistance in the source and drain. If the titanium silicide layer is formed on the surface of a source formation region in the above cell array, the source resistance can be reduced in even a memory cell distant from the common contact.

However, silicon heavily doped with arsenic hardly silicifies with titanium. To silicify silicon with titanium, the dose of arsenic as an impurity in silicon must be $2\times10^{15}/cm^2$ or less.

In the flash memory, the arsenic dose in the source and drain must be $5\times10^{15}/cm^2$ or more to increase the write/erase speed. If the arsenic dose in the diffusion layer is high, no titanium silicide layer can be formed, as described above.

The conventional flash memory cannot therefore perform high-speed read because the source contact is shared by a plurality of memory cells to reduce the cell size.

SUMMARY OF THE INVENTION

It is an object of the present invention to provide a semiconductor memory device capable of performing a high-speed read without increasing the cell size.

In order to achieve the above object, according to the present invention, there is provided a semiconductor memory device comprising a floating gate formed on a semiconductor substrate of a first conductivity type via a gate insulating film, a control gate formed on the floating gate via an insulating film, source and drain regions formed by diffusing an impurity of a second conductivity type in a surface of the semiconductor substrate on two sides of the floating gate, a lightly doped region of the second conductivity type formed with a surface exposed at a position distant from the floating gate in at least the source region, the lightly doped region having an impurity dose lower than an impurity dose of the source region, and a silicide layer formed on the exposed surface of the lightly doped region.

DESCRIPTION OF THE PREFERRED EMBODIMENTS

The present invention will be described below with reference to the accompanying drawings.

First Embodiment

Figure 1:
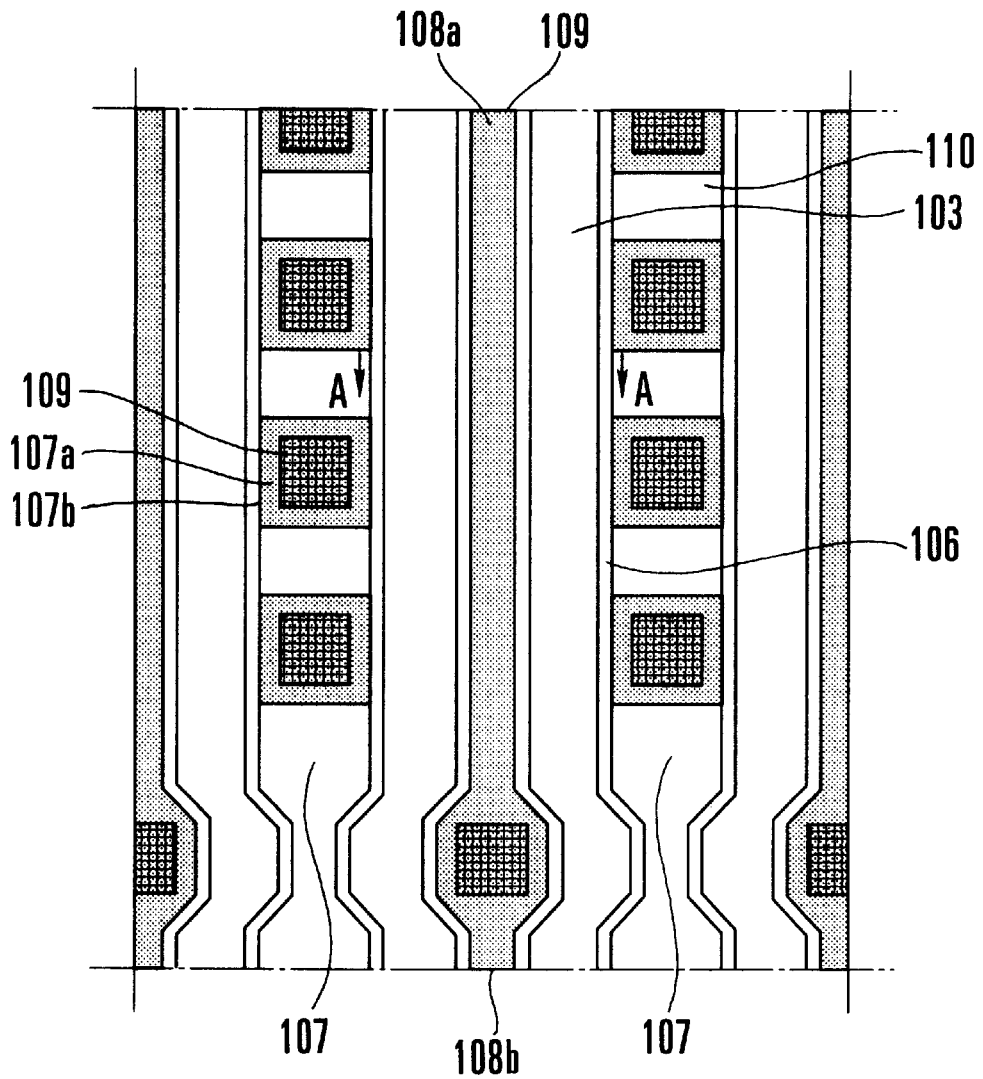
FIG. 1 is a plan view of a flash memory according to the first embodiment of the present invention.
Figure 2:
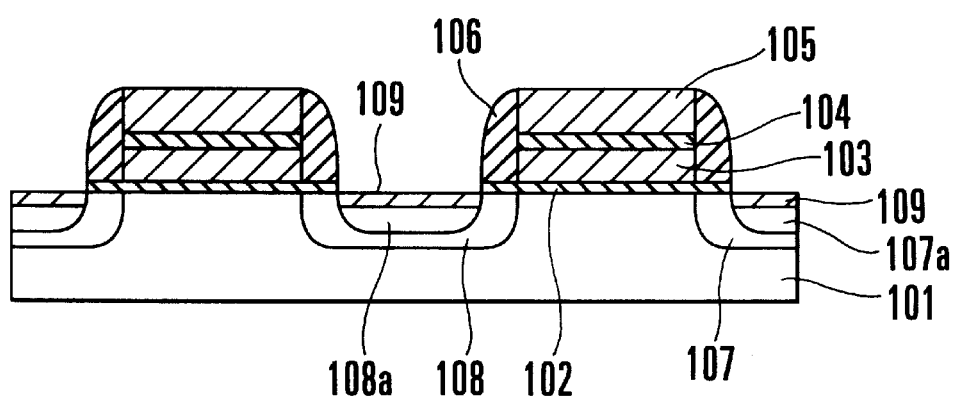
FIG. 2 is a sectional view taken along the line A—A in FIG. 1.

FIG. 1 shows a flash memory according to the first embodiment of the present invention. FIG. 2 shows the section of the flash memory taken along the line A—A in FIG. 1. Referring to FIG. 2, in the flash memory of the first embodiment, each floating gate 103 is formed on a semiconductor substrate 101 via a gate insulating film 102. A control gate 105 is formed on the floating gate 103 via an insulating film (ONO film) 104. The insulating film 104 has a three-layered structure obtained by sandwiching a silicon nitride film between silicon oxide films.

Insulating side walls 106 are formed on the side surfaces of the floating gate 103 and the control gate 105. A drain 107 and source 108 in which arsenic (impurity of the second conductivity type) is diffused as an impurity are formed in the semiconductor substrate 101 on the two sides of the floating gate 103. Lightly doped impurity regions 107a and 108a with a low dose of arsenic as an impurity are respectively formed in the drain 107 and source 108 between adjacent side walls 106. Titanium silicide layers 109 are formed on the surfaces of the lightly doped impurity regions 107a and 108a.

In the flash memory having the above sectional structure, as shown in FIG. 1, memory cell arrays are formed in the longitudinal direction (lateral direction in FIG. 1) of the gate to share the drains 107 and the sources 108. In a direction (longitudinal direction in FIG. 1) perpendicular to the longitudinal direction of the gate, a plurality of memory cells defined by element isolation regions 110 on the drain side are formed to constitute memory cell arrays. In each memory cell, a contact 107b is formed above the lightly doped impurity region 107a via the silicide layer 109.

The source side is not partitioned, and the common source 108 is continuously formed for a plurality of memory cells. A common contact 108b is formed above the continuous lightly doped impurity region 108a via the silicide layer 109 for a plurality of memory cells constituting memory cell arrays.

The impurity dose in the drain 107 and the source 108 is set to $5 \times 10^{15}/\text{cm}^2$, and thus the flash memory according to the first embodiment can realize a satisfactory write speed (electron extraction speed).

The impurity dose in the lightly doped impurity regions 107a and 108a is set to $2 \times 10^{15}/\text{cm}^2$ or less. The surfaces of the lightly doped impurity regions 107a and 108a can silicify with titanium, and the common contact 108b for extracting the source electrode can be formed via the silicide layer 109. Consequently, the source resistance can be greatly reduced in even a memory cell distant from the common contact 108b.

Figure 5A:
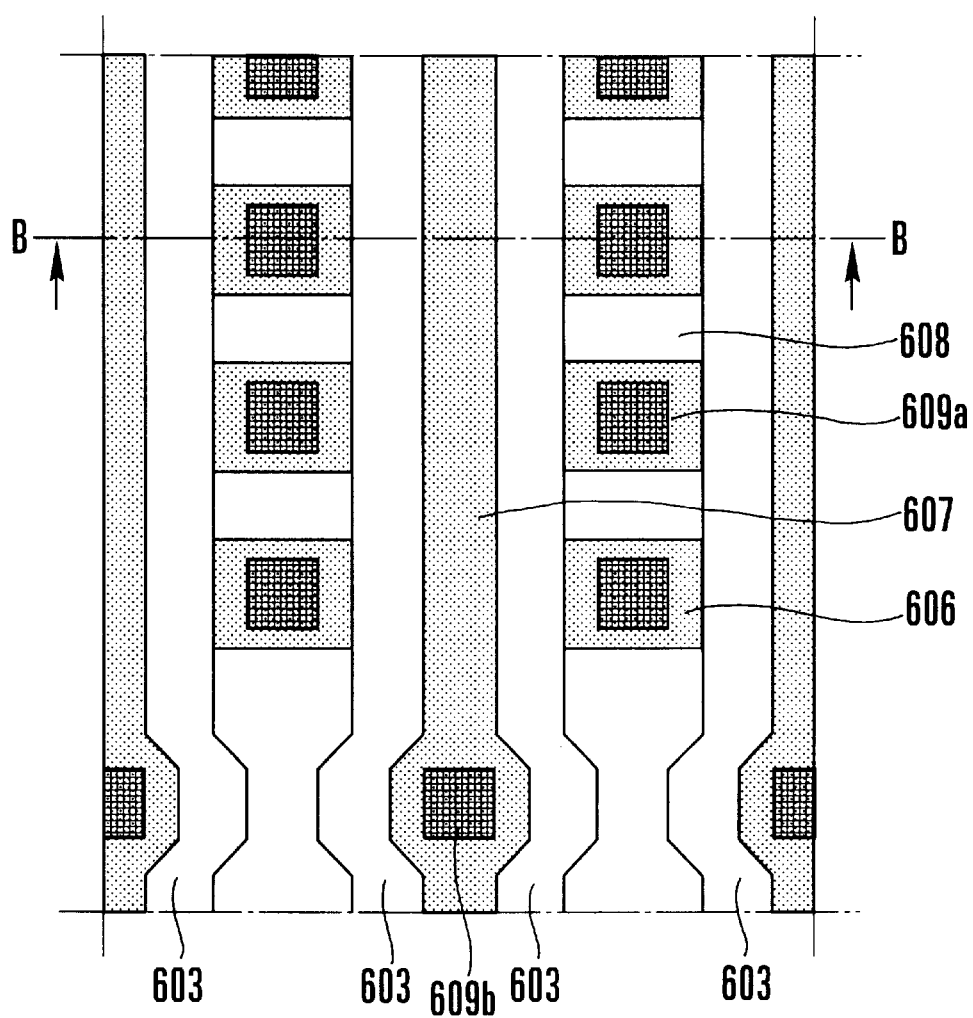
FIGS. 5A and 5B are a plan view of a conventional general flash memory, and a sectional view taken along the line B—B in FIG. 5A, respectively.
Figure 5B:
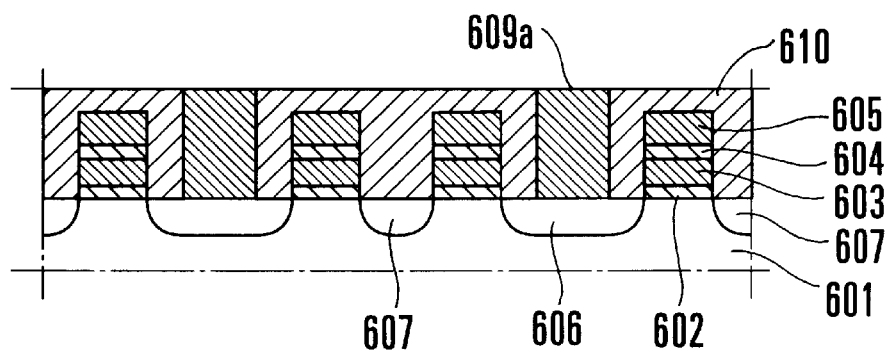

An interlevel insulating film (not shown; corresponding to the interlevel insulating film 610 in FIG. 5B) is formed on the semiconductor substrate 101 so as to cover the floating gate 103, the control gate 105, and the side wall 106. Each drain contact 107b and the common contact 108b are formed and connected to predetermined wiring layers via contact holes formed at predetermined positions in the interlevel insulating film, thereby completing the flash memory.

A method of manufacturing the flash memory shown in FIGS. 1 and 2 will be described below with reference to FIGS. 3A to 3E.

Figure 3A:
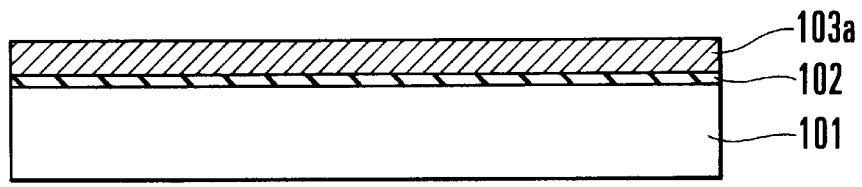
FIGS. 3A to 3E are sectional views, respectively, showing the steps in a method of manufacturing the flash memory shown in FIG. 1.

As shown in FIG. 3A, after a gate insulating film 102 is formed to a film thickness of 8 to 12 nm on the major surface of a semiconductor substrate 101, a polysilicon conductive layer 103a is formed to a film thickness of about 150 nm on the gate insulating film 102. At this time, an element isolation insulating film (not shown) is also formed.

Figure 3B:
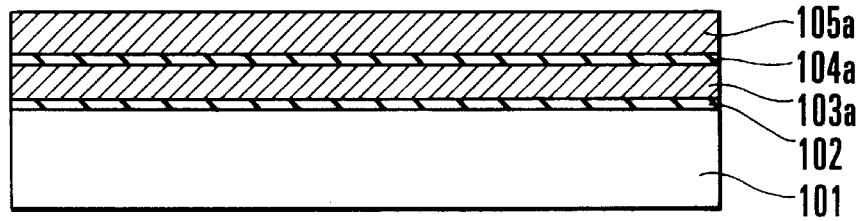

As shown in FIG. 3B, an insulating film (ONO film) 104a with a three-layered structure obtained by sandwiching a silicon nitride film between silicon oxide films is formed to a total thickness of 14 to 20 nm on the conductive layer 103a. A thick conductive layer 105a is formed on the insulating film 104a. The conductive layer 105a has a two-layered structure (silicide) made up of a 150-nm thick polysilicon layer and a 150-nm thick tungsten silicide layer.

Figure 3C:
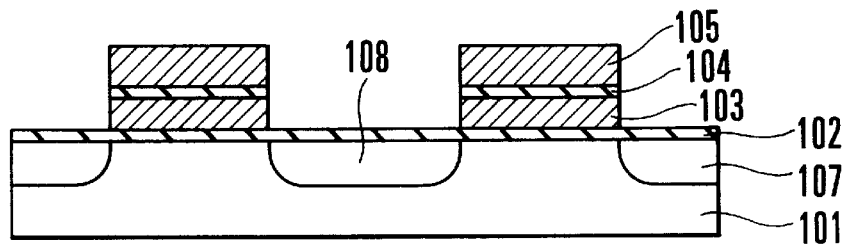

As shown in FIG. 3C, the conductive layer 105a, the insulating film 104, and the conductive layer 103a are simultaneously patterned by well-known photolithography and etching to form a floating gate 103, an insulating film 104, and a control gate 105. Using the control gate 105 as a mask, arsenic is doped in the semiconductor substrate 101 at a high dose ($5 \times 10^{15}/\text{cm}^2$) to form a drain 107 and a source 108.

Figure 3D:
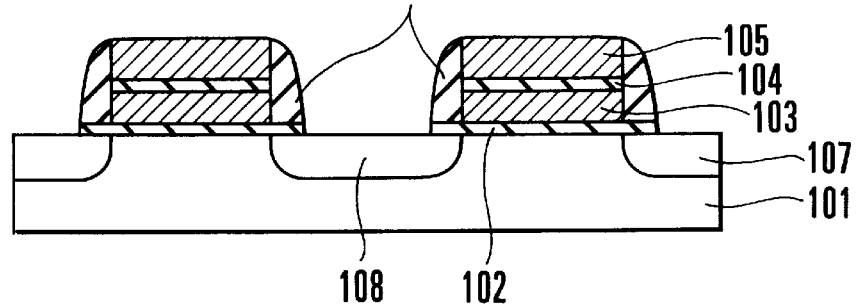

An insulating film (not shown) is formed on the semiconductor substrate 101 to cover the control gate 105. This insulating film is formed by, e.g., CVD (Chemical Vapor Deposition). The insulating film is vertically etched by anisotropic reactive ion etching to form side walls 106 on the side surfaces of the floating gate 103, the insulating film 104, and the control gate 105, as shown in FIG. 3D.

Figure 3E:
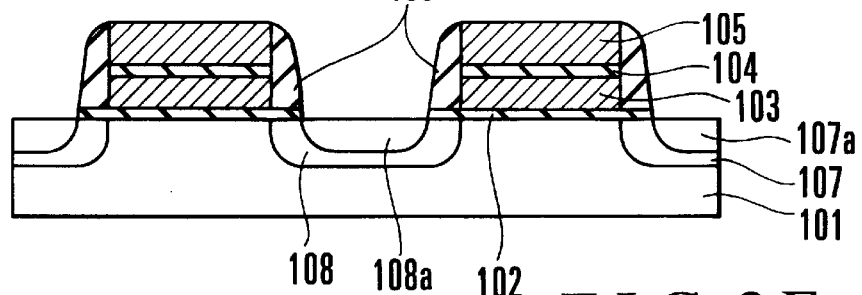

The resultant structure is annealed at 850° C. for 60 min. By this annealing, arsenic externally diffuses from the exposed regions of the drain 107 and the source 108 between adjacent side walls 106. As a result, lightly doped impurity regions 107a and 108a with a low arsenic dose are formed, as shown in FIG. 3E.

As shown in FIG. 2, titanium silicide layers are formed on the surfaces of the lightly doped impurity regions 107a and 108a to complete a memory cell constituting the flash memory. Note that the side walls 106 may be removed after silicide layers 109 are formed.

Second Embodiment

A method of manufacturing a flash memory according to the second embodiment of the present invention will be explained with reference to FIGS. 4A to 4G.

By the steps in FIGS. 4A to 4D, a floating gate 103, an insulating film 104, a control gate 105, and side walls 106 are formed on a semiconductor substrate 101. These steps are the same as the steps in FIGS. 3A to 3D, and a description thereof will be omitted.

Figure 4A:
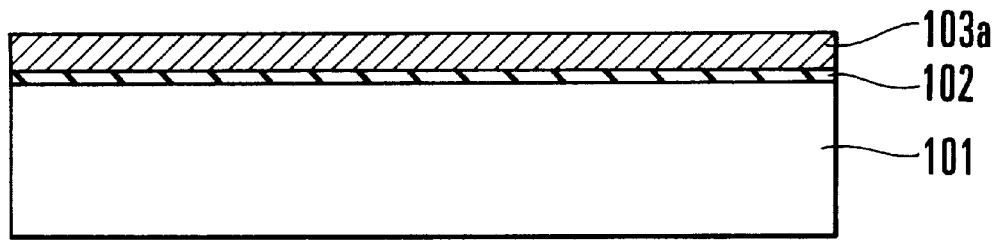
FIGS. 4A to 4G are sectional views, respectively, showing the steps in a method of manufacturing a flash memory according to the second embodiment of the present invention.
Figure 4B:
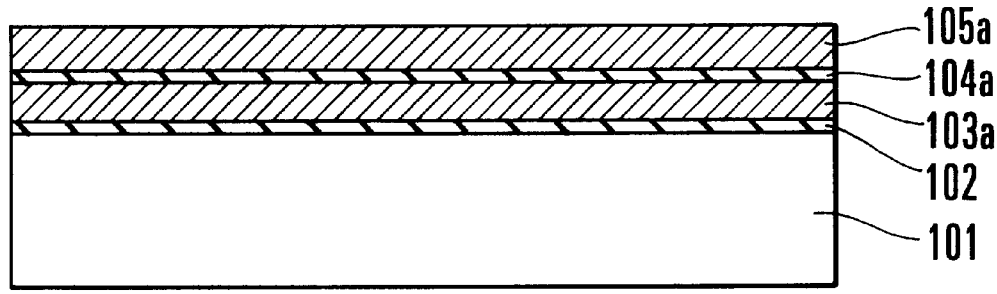
Figure 4C:
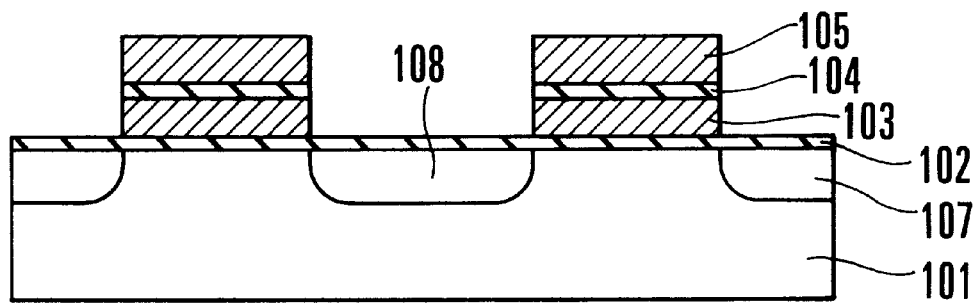
Figure 4D:
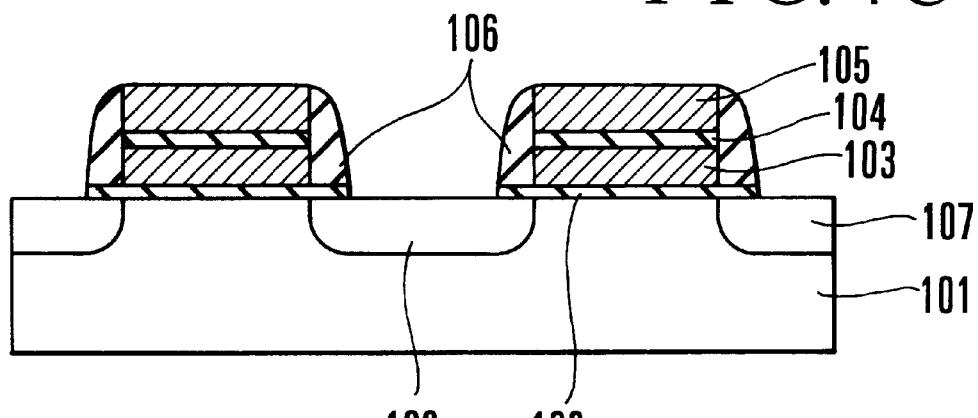
Figure 4E:
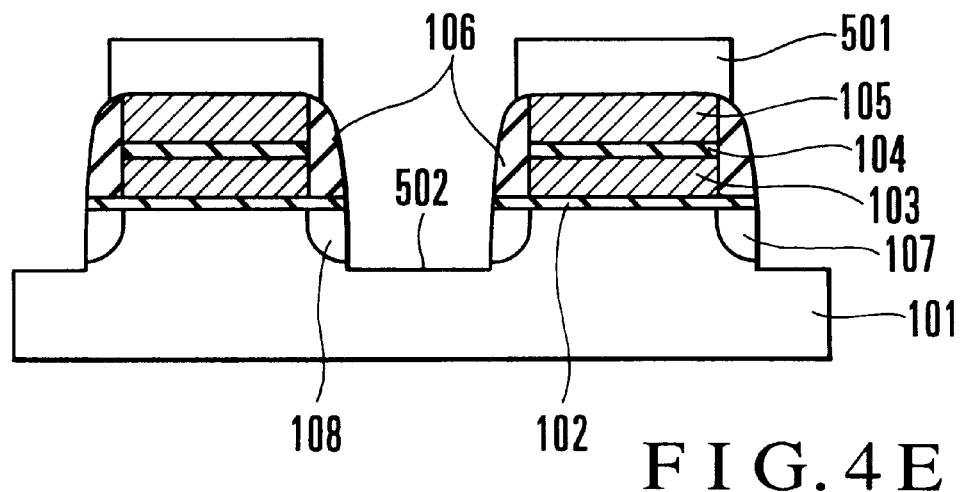

As shown in FIG. 4E, a resist pattern 501 is formed on the control gate 105 so as to cover part of each side wall 106. Using the resist pattern 501 and the side walls 106 as a mask, the semiconductor substrate 101 is selectively etched to form grooves 502. Each groove 502 desirably has a depth of about 0.3 $\mu$m larger than the diffusion depth of arsenic forming a drain 107 and a source 108. In this stage, the drain 107 and the source 108 to be shared by adjacent memory arrays are temporarily divided for each memory array.

Figure 4F:
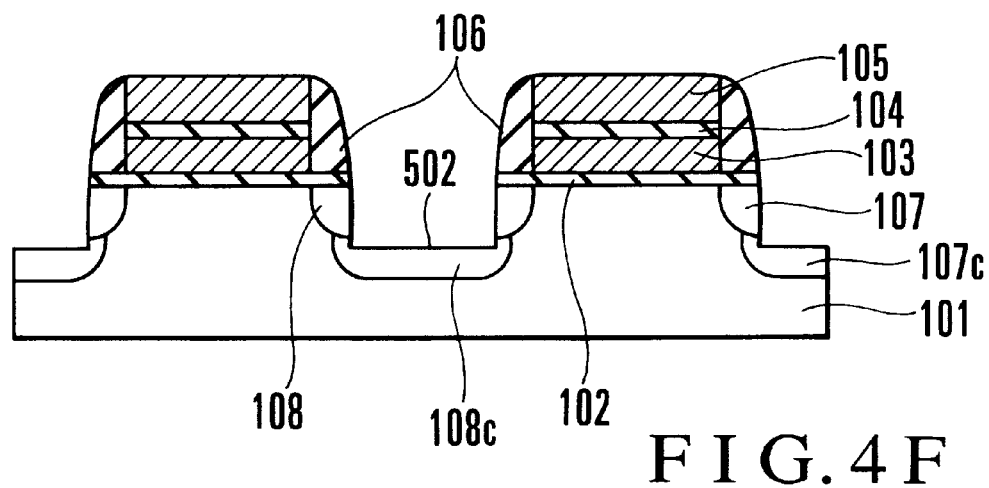

As shown in FIG. 4F, the resist pattern 501 is removed, and then arsenic is ion-implanted using the control gate 105 and the side walls 106 as a mask. By this ion implantation, lightly doped impurity regions 107c and 108c are formed at the bottoms of the grooves 502 so as to contact the divided drain 107 and the source 108 at two ends. At this time, ions are implanted in a direction inclined by 30° from the normal line of the major surface of the semiconductor substrate 101 while the semiconductor substrate 101 is rotated. The ion implantation dose is set to $2 \times 10^{15}/\text{cm}^2$. Accordingly, the surfaces of the lightly doped impurity regions 107c and 108c do not obstruct titanium silicification.

Figure 4G:
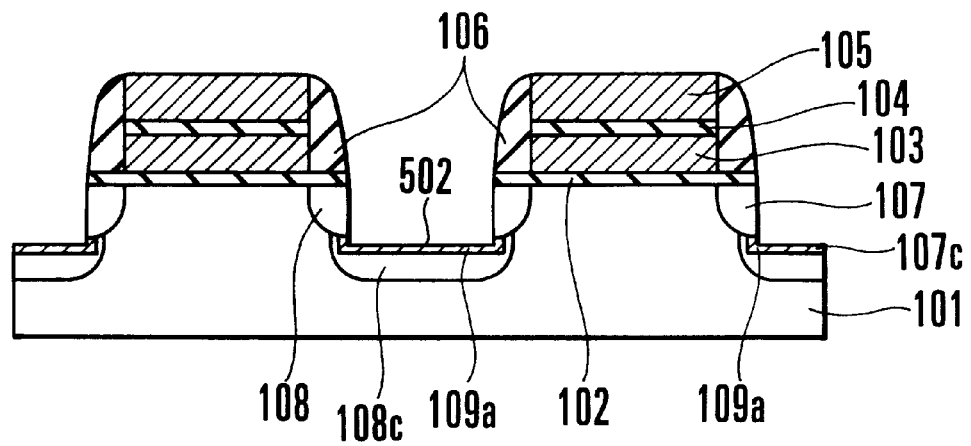

As shown in FIG. 4G, titanium silicide layers 109a are formed on the exposed surfaces of the lightly doped impurity regions 107c and 108c. Similar to the first embodiment, an interlevel insulating film is formed on the semiconductor substrate 101 so as to cover the floating gate 103, the control gate 105, and the side walls 106.

Each drain contact and a common source contact are formed and connected to predetermined wiring layers via contact holes formed at predetermined positions in the interlevel insulating film, thereby completing the flash memory.

Also in the flash memory having this arrangement, the source resistance can be greatly reduced in even a memory cell distant from the common source contact.

In the second embodiment described above, the groove 502 is made deeper than the diffusion depth of arsenic forming the drain 107 and the source 108. The present invention is not limited to this. For example, the groove 502 may be made shallower than the diffusion depth of arsenic forming the drain 107 and the source 108.

In this case, the drain 107 and the source 108 formed in the semiconductor substrate 101 at the bottoms of the grooves 502 may serve as lightly doped regions so as not to obstruct titanium silicification. The drain 107 and the source 108 should not be divided. By forming the groove 502 in this way, the silicide layer 109a can be formed without newly ion-implanting arsenic.

In the first and second embodiments, the titanium silicide layer 109a is formed on the drain 107. Instead, the titanium silicide layer 109a may be formed on only the source 108. Note that the contact resistance can be reduced in the drain by forming the titanium silicide layer 109a on the drain.

As has been described above, according to the present invention, when a plurality of memory cells using common sources and drains are formed, and a common source contact is formed for the memory cells, the resistance can be decreased in the region extending from the source contact to each memory cell. As a result, a high-speed read can be performed without increasing the cell size.

What is claimed is:

1. A semiconductor memory device comprising:

a floating gate formed on a semiconductor substrate of a first conductivity type via a gate insulating film;

a control gate formed on said floating gate via an insulating film;

source and drain regions formed by diffusing an impurity of a second conductivity type in a top surface of said semiconductor substrate on two sides of said floating gate, wherein said source region is formed in a groove of said semiconductor substrate;

a lightly doped region of the second conductivity type formed with a surface exposed at a position distant from said floating gate in the source and drain regions, the lightly doped region having an impurity dose lower than an impurity dose of the source region, wherein an impurity concentration of the position distant from said floating gate in at least the source region is lighter than that of a position near said floating gate; and a silicide layer formed on the exposed surface of the lightly doped region.

2. A device according to claim 1, wherein said device further comprises a side wall made of an insulating film on side surfaces of said floating gate and said control gate on at least the source region side, and the lightly doped region is formed at a position distant from said floating gate by a thickness of said side wall.

3. A device according to claim 1, wherein the groove is formed in said semiconductor substrate and extends to an area deeper than a diffusion depth of the impurity forming the source region.

4. A device according to claim 1, wherein said floating gate, said control gate, said source region, said drain region, the lightly doped region, and said silicide layer constitute a memory cell.

5. A device according to claim 4, further comprising:

a memory cell array constituted by a plurality of memory cells sharing said source region;

a common source region in which source regions of said memory cells constituting said memory cell array are continuously formed;

a source contact formed on said silicide layer in the common source region, said source contact being electrically connected to the common source region via said silicide layer and the lightly doped impurity region; and a plurality of drain contacts individually formed in drain regions of said memory cells.

6. A device according to claim 1, wherein said silicide layer is formed in said groove at a level below said source region and in contact with said source region.

7. A device according to claim 1, wherein said groove has a depth of about 0.3 $\mu$m below said top surface of said semiconductor substrate.

8. A device according to claim 1, wherein said source and said drain regions have a first impurity concentration to increase a write/erase speed, the lightly doped region has a second impurity concentration to form the silicide layer, and the second impurity concentration is lower than the first impurity concentration.

* * * * *